(12) United States Patent
Bhatia et al.

(10) Patent No.: US 10,187,086 B2
(45) Date of Patent: Jan. 22, 2019

(54) STATE-BASED DECODING OF PRODUCT CODES

(71) Applicant: SK Hynix Inc., Gyeonggi-do (KR)

(72) Inventors: Aman Bhatia, San Jose, CA (US);
Naveen Kumar, San Jose, CA (US);
Yi-Min Lin, San Jose, CA (US); Fan Zhang, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/460,165

(22) Filed: Mar. 15, 2017

(65) Prior Publication Data

US 2018/0269905 A1 Sep. 20, 2018

(51) Int. Cl.
| | |
|---|---|
| *H03M 13/11* | (2006.01) |
| *H03M 13/00* | (2006.01) |
| *G06F 3/00* | (2006.01) |
| *H03M 13/29* | (2006.01) |
| *H03M 13/15* | (2006.01) |

(52) U.S. Cl.
CPC ... *H03M 13/2909* (2013.01); *H03M 13/1108* (2013.01); *H03M 13/152* (2013.01); *H03M 13/2948* (2013.01)

(58) Field of Classification Search
None
See application file for complete search history.

(56) References Cited

U.S. PATENT DOCUMENTS

| | | | |
|---|---|---|---|
| 2014/0325320 A1 | 10/2014 | Subramanian | |
| 2016/0182087 A1* | 6/2016 | Sommer | H03M 13/1148 714/752 |
| 2017/0279468 A1* | 9/2017 | Kumar | H03M 13/458 |
| 2018/0048332 A1* | 2/2018 | Kumar | H03M 13/2927 |

\* cited by examiner

*Primary Examiner* — Justin R Knapp
(74) *Attorney, Agent, or Firm* — Kilpatrick Townsend & Stockton LLP

(57) ABSTRACT

Techniques for reducing the latency for decoding product codewords with minimal hardware architecture changes are described. In an example, multiple decoding procedures are available a system. The system maintains decoding states. Each decoding state corresponds to a constituent codeword of a product codeword and to a decoding procedure. For instance, a BCH decoding state indicates whether the decoding of the respective BCH constituent codeword has previously failed. The decoding of the product codeword depends on the various decoding state. For instance, in a BCH decoding iteration, if a BCH decoding state of a constituent codeword is set to "failed," the BCH decoding of that codeword is skipped.

20 Claims, 6 Drawing Sheets

STATE-BASED DECODING OF PRODUCT CODES

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND

Data storage and transmission over noisy channels necessitate the use of error-correcting codes (ECCs) to improve or guarantee data reliability. Product codes are an example of an ECC scheme constructed using constituent codes of smaller length compared to the code length and encoding data in multiple dimensions after data interleaving. Each bit of a product codeword is part of multiple constituent codewords. Product codes may be decoded using an iterative decoder such that, in every iteration, each constituent codeword decoding is performed at least once. These iterations are repeated till all constituent codewords have been decoded successfully, or the maximum number of iterations is reached. In the former case, the product codeword is decoded successfully and in the latter case, the product codeword decoding fails.

When the initial received codeword contains a moderate number of errors, only a few constituent codewords may be decoded successfully in each iteration. As a result, the decoding of a product codeword may involve many constituent codeword decoding attempts, and therefore take a large amount of time. This can restrict the use of product codes in applications which are latency sensitive with respect to decoding.

BRIEF SUMMARY

Techniques for codeword decoding are described. In an example, a system implements multiple decoding procedures. The system maintains a first decoding state and a second decoding state associated with decoding a first constituent codeword according to a first decoding procedure and a second decoding procedure, respectively. The first constituent codeword is one of a plurality of constituent codewords that constitute a codeword, such as a product codeword. A data bit of the codeword is protected by the first constituent codeword and by at least a second constituent codeword of the codeword. In an iteration to decode the codeword according to the first decoding procedure, and prior to decoding the first constituent codeword according to the first decoding procedure, the system determines whether the first decoding state indicates a decoding failure. If the first decoding state indicates the decoding failure, the system skips the decoding of the first constituent codeword according to the first decoding procedure. The second decoding procedure can be used instead. If the first decoding state does not indicate the decoding failure, the system decodes the first constituent codeword according to the first decoding procedure. This decoding corrects (e.g., flips) the data bit common with the second constituent codeword to correct an error. Further, the system updates a decoding state of the second constituent codeword based on the correcting of the data bit. This decoding state associated with decoding the second constituent codeword according to the first decoding procedure.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
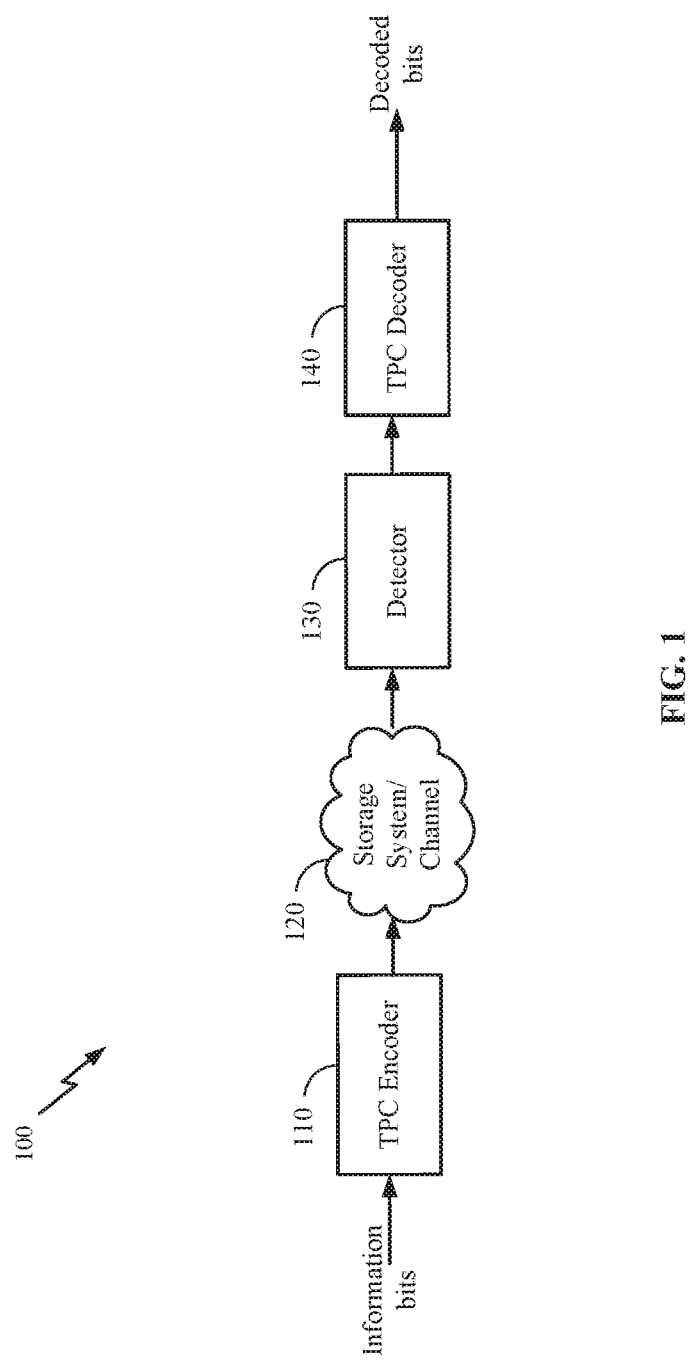
FIG. 1 illustrates an example high level block diagram of a turbo product code (TPC) error correcting system, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of the present disclosure are directed to a novel decoder architecture that reduces the latency for hard and soft decoder for product codes with minimal hardware architecture changes. In product code, a data bit is protected by (e.g., found in) at least two constituent codewords. The embodiments take advantage of this property of product codes and rely on state information to improve the decoding. The improvement can include a reduction in decoding latency while maintaining a particular bit error rate (BER) performance.

In an example embodiment, a decoding system implements multiple decoding procedures, such as Bose-Chaudhuri-Hocquenghem (BCH) decoding, Chase decoding, and/or other decoding procedures. These procedures have varying complexities resulting in different performances. For instance, a less complex decoding procedure (e.g., BCH decoding) has a worse BER performance (e.g., a higher BER) but a better latency performance (e.g., a smaller latency) relative to a more complex decoding procedure (e.g., Chase decoding). Decoding states are maintained for each constituent codeword of the product code per decoding procedure. Each decoding state indicates whether the relevant decoding procedure failed or not to decode the relevant constituent codeword. For instance, a first decoding state for a constituent codeword indicates that decoding the constituent codeword with the first decoding procedure failed. A second decoding state for that same constituent codeword indicates that its decoding did not fail with the second decoding procedure.

The decoding states are initialized to "unknown" (e.g., by using a value of "0" in an array that stores the decoding state information) indicating that it is unknown if the decoding procedures failed or not. The decoding can start with the least complex decoding procedure (e.g., the BCH decoding procedure). If this procedure fails to decode a particular constituent codeword, the decoding state corresponding to the particular constituent codeword and decoding procedure is set to "failed" (e.g., by using a value of "1" in the array) or some other indications of the decoding failure. Otherwise, the decoding state is left as "unknown." Because each data bit in the particular constituent codeword also belongs to at least one different constituent codeword, an opportunity to update the decoding state of the particular constituent codeword exists once the other constituent codewords are decoded. For instance, if the decoding of another constituent codeword corrects a data bit common with the particular constituent codeword, the decoding state of the particular constituent codeword is updated to "unknown" if it was set to "failed."

In a next iteration for decoding the product code using that same decoding procedure, if a decoding state of a constituent codeword is set to "failed," the decoding procedure is not applied to that codeword (e.g., its decoding is skipped). By skipping the decoding of constituent codewords for which it is known that the decoding procedure previously failed (given the decoding state information), the latency of the decoding procedure is reduced.

In another iteration for decoding the product code using a more complex decoding procedure (e.g., the Chase decoding procedure), a determination is made for each constituent codeword whether this decoding procedure should be applied thereto. If so, the constituent codeword is decoded using the more complex decoding procedure. The decoding is similar to the above approach in which the decoding states are initialized to "unknown" and updated to "failed" as applicable. If the determination is to avoid using the more complex decoding procedure, this decoding is not performed. Thus, by selectively and intelligently applying more complex decoding procedure, a similar BER performance can be achieved but at a much smaller latency. In other words, by combining the variable-complexity decoding procedures, the BER performance of the more complex decoding procedure can be achieved with a latency performance relatively closer to the less complex decoding procedure.

The determination of whether the more complex decoding procedure should be applied to a constituent codeword is based on the decoding state information of that codeword for this procedure and for the less complex decoding procedure(s). For instance, if the decoding state of the less complex decoding procedure is "failed" and the decoding state of the more complex decoding procedure is "unknown," the more complex decoding procedure should be used to decode the constituent codeword. If the decoding state of the more complex decoding procedure is "failed," this procedure should not be used. If the decoding state of the less complex decoding procedure is "unknown," the more complex decoding procedure can be used depending on whether the less complex decoding procedure resulted in an error free decoding or not. For instance, if the decoded constituent codeword was error free according to the less complex decoding procedure, the more complex decoding procedure could be skipped. Otherwise, the more complex decoding procedure should be used.

The above example uses a two-value state: "unknown" and "failed." However, a higher dimensional state (e.g., with three values or more) can be used. For instance, a decoding state can also be set to "error free" indicating that the relevant decoding procedure successfully decoded the relevant constituent codeword, where each decoded data bit is error free (e.g., does not contain an error such as a "0" instead of a "1"). In this case, when determining whether a more complex decoding procedure should be used for a constituent codeword, if the decoding state of that constituent codeword for a less complex decoder is "error free," the determination is to skip the more complex decoding procedure.

The decoding of the product code is generally iterative. Because multiple decoding procedures are available, local iterations or global iterations can be used. Under a local iteration approach, a decoding procedure is iteratively repeated for a number of times. Thereafter, the decoding moves to the next decoding procedure, which is iteratively repeated, and so on and so forth. Under a global iteration approach, the first decoding procedure is performed once. The next decoding procedure is then performed once, and so and so forth until the last available decoding procedure is performed once. Thereafter, the decoding is looped back to the first decoding procedure and the decoding is repeated. The looping can be repeated for a number of times. Of course a hybrid of both approaches can be used, where a decoding procedure is locally iterated within an iterative global loop.

To illustrate, consider the example of a local iteration approach that uses BCH and Chase decoding and a two-value state of "unknown" and "failed." BCH decoding is generally the least complex of the two decoding procedures. In this example, the decoding of a product code starts with using the BCH decoding iteratively. In one of the iterations, if a first constituent codeword has a BCH decoding state of "unknown," it is decoded. Otherwise, it is skipped. If decoded, the BCH decoding may correct one particular data bit (e.g., flip it from "0" to "1" or vice versa). That data bit is common with second constituent codeword. If the BCH decoding state of the second constituent code is "failed," this state is changed to "unknown." Otherwise, the sate remains "unknown." Similarly, a third constituent codeword is decoded and one of its data bit is corrected. This corrected data bit is common with the first constituent codeword.

Accordingly if the BCH decoding state of the first constituent codeword was updated to "failed," it is changed back to "unknown." Otherwise, this state stays the same. In a next iteration, the decoding and state updates are repeated. It is important to note that, if in one iteration of the BCH decoding, a particular constituent codeword is successfully decoded (e.g., its syndrome is zero), in the next iteration, that particular constituent codeword need not be decoded again. Hence, the syndrome of a constituent codeword can, in effect, act as an "error free" state. In this way, the decoding latency can be further reduced.

Once the BCH decoding is complete (e.g., the maximum number of iterations is reached), the decoding can move to the Chase decoding if any constituent codeword has a BCH decoding state of "failed" or a non-zero syndrome. For this specific set of constituent codewords (e.g., the ones having non-zero syndromes or "failed" BCH decoding states), the Chase decoding is iteratively repeated. To speed up the Chase decoding, this decoding need not be used for the remaining constituent codewords because they were already decoded with the BCH decoding procedure successfully (e.g., each of these already decoded constituent codewords has a zero syndrome). In each iteration, the Chase decoding states are updated and the decoding performed accordingly (e.g., the decoding skips the constituent codewords that have a Chase decoding state of "failed").

In the interest of clarity of explanation, the embodiments of the present disclosure are described in connection with two decoding procedures: BCH decoding and Chase decoding. However, the embodiments similarly apply to other types and a different number of decoding procedures. Generally, a decoding state is maintained for each constituent codeword per decoding procedure. A decoding state of a particular constituent codeword for a particular decoding procedure s is used to determine whether that particular constituent codeword should be decoded with that particular decoding procedure. If so, the decoding is performed. Otherwise, the decoding is skipped.

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes may include turbo product codes (TPC), low density parity check codes (LDPC), Bose-Chaudhuri-Hocquenghem (BCH) codes, Reed Solomon codes, and the like.

Turbo product codes (TPCs) are a promising candidate for correcting errors in storage applications. Turbo product codes may include two or more dimensions, each of which corresponding to a class of error correcting codes, such as BCH codes, Reed Solomon codes, or the like. The ECC code corresponding to each dimension of the TPC code is referred to herein as a constituent code. In one example, a two-dimensional TPC codeword may include one or more error correcting codewords (e.g., BCH codewords) corresponding to its first dimension, and one or more error correcting codewords corresponding to its second dimension.

TPC codes may be decoded by performing an iterative decoding procedure on the constituent codewords in one or more dimensions. As an example, for decoding a TPC code with BCH constituent codes, the TPC decoder performs BCH decoding on one or more codewords in the first dimension and one or more codewords in the second dimension of the TPC code. The TPC decoder may iteratively continue the decoding process until either a correct codeword is found or decoding failure is declared.

The term "hard decision" is used herein to refer to a bit that comprises a "0" or a "1" value, and is associated with a particular location within a codeword. A "hard decision" may also be referred to as a "hard output" or "hard information." In some embodiments, the reliability of each hard decision may be known. The "reliability" of a hard decision refers to a probability (e.g., a value from "0" through "1") that the corresponding hard decision is correct. A "reliability" may also be referred to as "soft information" or a "soft output." In a NAND channel, a reliability for each bit may be obtained, for example, by multiple read operations from the NAND memory using different thresholds. In general, if the hard decision decoding of a codeword fails, soft information can be used to decode the failed codeword using soft decoding techniques, such as Chase decoding.

In Chase decoding, the least reliable bits are flipped and hard decoding is performed multiple times. The outputs of successful hard decoding procedures are sorted according to the Euclidean distance to the received codeword, and the closest codeword is selected as a candidate decoded codeword. This is usually followed by an additional procedure (e.g., miscorrection avoidance thresholding (MAT)) to determine whether the selected candidate codeword (e.g., output of the Chase decoder) is the correct codeword or if it is a miscorrected codeword. In one example, when a miscorrection is declared, no changes are made to the received codeword in that iteration of Chase decoding to avoid adding new errors in the codeword.

FIG. 1 illustrates an example high level block diagram of a TPC error correcting system, in accordance with certain embodiments of the present disclosure. In the example shown, TPC encoder 110 receives information bits that include data which is desired to be stored in a storage system 120 or transmitted in a communications channel. TPC encoded data is output by TPC encoder 110 and is written to storage 120. In various embodiments, storage 120 may include a variety of storage types or media, such as magnetic disk drive storage, Flash storage, etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested or otherwise desired (e.g., by an application or a user), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to TPC decoder 140 which performs TPC decoding using the decision and/or reliability information. A soft input decoder utilizes both the decision and the reliability information to decode the codeword. A hard decoder utilizes only the decision values in the decoder to decode the codeword. After decoding, the decoded bits generated by TPC decoder are passed to the appropriate entity (e.g., the user or application which requested it). With proper encoding and decoding, the information bits match the decoded bits.

In the interest of clarity of explanation, the embodiments of the present disclosure are described in connection with TPC codes. However, the embodiments are not limited as such and apply, similarly, to other types of product codes, such as generalized product codes (GPC) and generalized low density parity check codes (G-LDPC). Generally, a product code includes constituent codewords. Each data bit is common to at least two constituent codewords. The embodiments of the present disclosure can take advantage of this structure of the product code (e.g., where each data bit is common to at least two constituent codewords) in association with state information. In particular, a decoding state (e.g., a BCH decoding state or a Chase decoding state) of a particular constituent codeword of a product code (whether TPC, GPC, G-LDPC, or some other product code) is updated (e.g., changed from "failed" to "unknown") if a data bit common with another constituent codeword of the product code is corrected (e.g., flipped between the values of "0" and "1") when the other constituent codeword is decoded.

Figure 2:
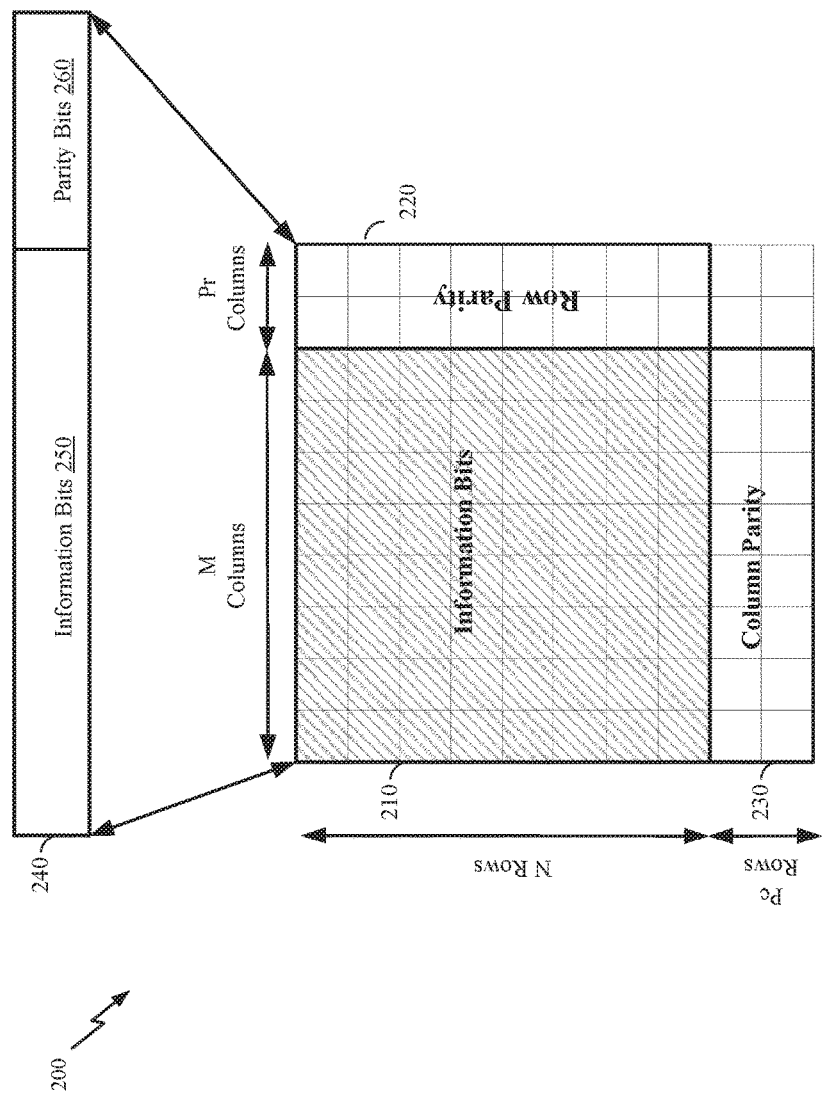
FIG. 2 illustrates an example block diagram of a two-dimensional TPC codeword, in accordance with certain embodiments of the present disclosure.

FIG. 2 illustrates an example block diagram of a two-dimensional TPC codeword 200, in accordance with certain embodiments of the present disclosure. Of course, a higher number of dimensions is possible. As illustrated, the TPC codeword 200 may be a matrix of size $(N+P_c) \times (M+P_r)$, in which N represents number of rows of information bits, M represents number of columns of information bits, $P_r$ represents number of row parity bits, and $P_c$ represents number of column parity bits. Information bits can be represented by a matrix of size N×M (e.g., matrix 210), row parity bits can be represented by a matrix of size $N \times P_r$ (e.g., matrix 220), and column parity bits may be represented by a matrix of size $P_c \times M$ (e.g., matrix 230). The TPC codeword may include N constituent codewords corresponding to its first dimension (e.g., row codewords), and M constituent codewords corresponding to its second dimension (e.g., column codewords). Each row codeword 240 includes multiple information bits 250 and one or more parity bits 260. Similarly, each column codeword includes multiple information bits and one or more parity bits. As an example, if BCH codes are used for the rows and columns, the row codewords 1 through N and the column codewords 1 through M are constructed using BCH encoding. Other encoding techniques are possible, such as Reed Solomon encoding. Further, the rows and columns need not use the same encoding techniques. For instance, the row codewords can be constructed using BCH encoding while the column codewords can be constructed using constructed using Reed Solomon encoding.

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

Figure 3:
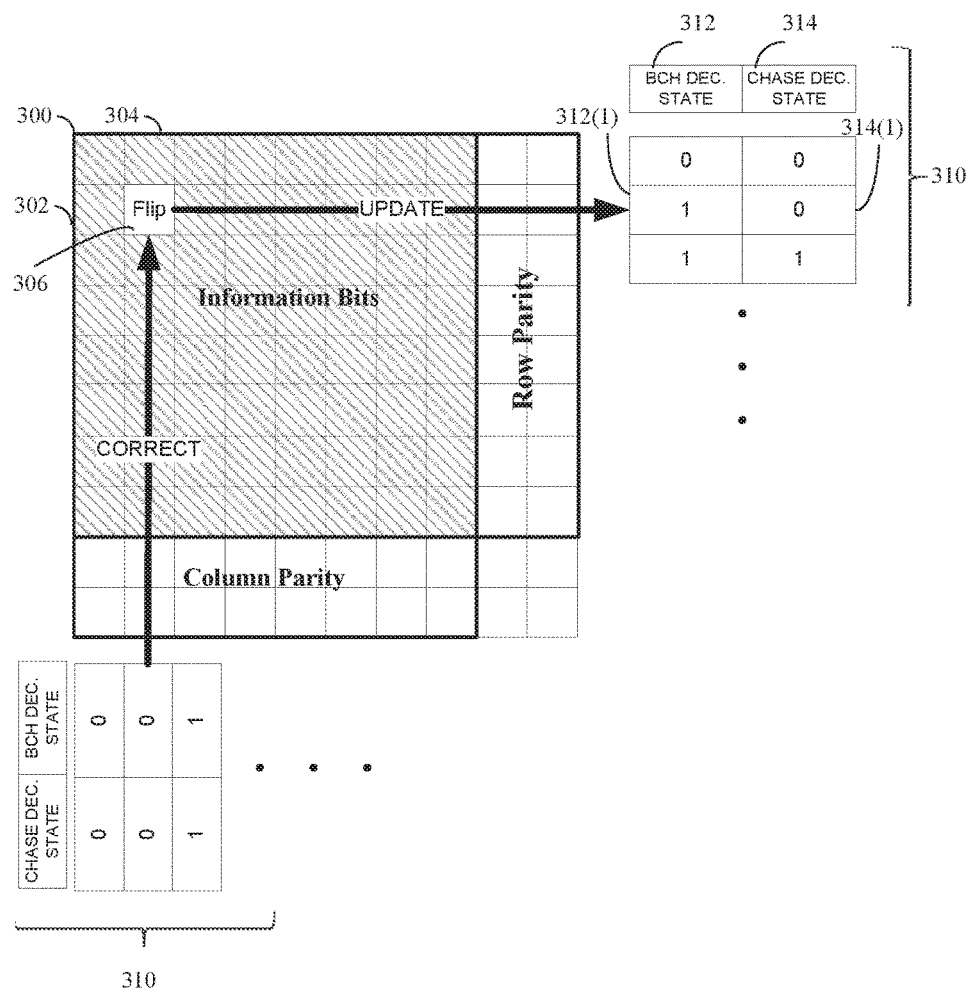
FIG. 3 illustrates an example use of state information to decode a two-dimensional TPC codeword, in accordance with certain embodiments of the present disclosure.

FIG. 3 illustrates an example use of decoding state information to decode a TPC codeword 300, in accordance with certain embodiments of the present disclosure. A two-dimensional TPC codeword is illustrated. However, the embodiments of the present disclosure similarly apply to higher dimensions for a TPC codeword. As illustrated, two decoding procedures are used: BCH decoding and Chase decoding. For each constituent codeword, a decoding state is maintained per decoding procedure.

Similarly to FIG. 2, the TPC codeword 300 includes constituent codewords. The row codewords are the constituent codewords found across the rows, each containing data bits and parity bits from a row. The column codewords are the constituent codewords found across the columns, each containing data bits and parity bits from a column. The constituent codewords are associated with decoding state information 310.

The decoding state information 310 contains BCH decoding states 312 and Chase decoding states 314. Each of the decoding states can be set to a value from possible values. These values represent flags that indicate whether previous decoding failed or not and no updates have occurred since (e.g., no bits corrected or flipped). In an example, a two-value state is used. In this example, the decoding state can be set to "unknown" by using a value of "0," for instance. The decoding state can be set to "failed" by using a value of "1," for instance. Of course other values are possible. A "1" value for a state of a particular constituent codeword and for a particular decoding procedure indicates that the decoding of this constituent codeword failed in some previous decoding iteration that used the decoding procedure and no bit belonging to this constituent codeword has changed since the last decoding iteration.

Of course, a different number of values can be used. For instance, a decoding state can also be set to "error free" by using a particular value. An "error free" of a particular constituent codeword for a particular decoding procedure indicates that the decoding of this constituent codeword was correct in some previous decoding iteration that used the decoding procedure (e.g., the decoded data bits do not contain any errors). In the example of BCH and Chase decoding, if a decoded constituent codeword has a zero syndrome, the decoding is error free.

In an example, the decoding state information 310 can be stored as arrays of values or flags in memory of the decoding system, where one array is stored per decoding procedure. Each array stores one bit of information for each constituent codeword for the applicable decoding procedure. When applying a decoding procedure, the decoding of a constituent codeword with a "failed" decoding state for that procedure is skipped. This decoding state is changed to "unknown" if any bit belonging to that constituent codeword is corrected (e.g., flipped) according to the decoding of another constituent codeword. Also, the decoding of a constituent codeword with an "error free" decoding state (if such a state value is used) for that procedure is skipped. If this "error free" decoding state is not used, the decoding can be skipped depending on whether the constituent codeword has a zero syndrome from a previous iteration or not.

To illustrate, consider the example of the second row codeword 302. That constituent codeword has two decoding states. Its BCH decoding state 312(1) indicates that in a previous BCH decoding iteration, the BCH decoding of the second row codeword 302 failed. When a next BCH decoding iteration is performed, the BCH decoding of this second row codeword 302 is skipped. In comparison, its Chase decoding state 314(1) indicates that in a previous Chase decoding iteration, the Chase decoding of the second row codeword 302 did not fail. When a next Chase decoding iteration is performed, the Chase decoding of this second row codeword 302 is performed.

In the above illustrative example, further assume that the second row codeword 304 was corrected during the next BCH decoding iteration. The correction occurred after the second row codeword 302 was skipped because of its BCH decoding state 312(1) is "failed." The correction also resulted in flipping a data bit 306 that is common with the second row codeword 302. Because this common data bit 306 was flipped, the BCH decoding state 312(1) of the second row codeword 302 should be updated to "unknown." In that same iteration or in a subsequent iteration, the BCH decoding can be applied to the second row codeword 302 because its updated BCH decoding state is now "unknown."

Figure 4:
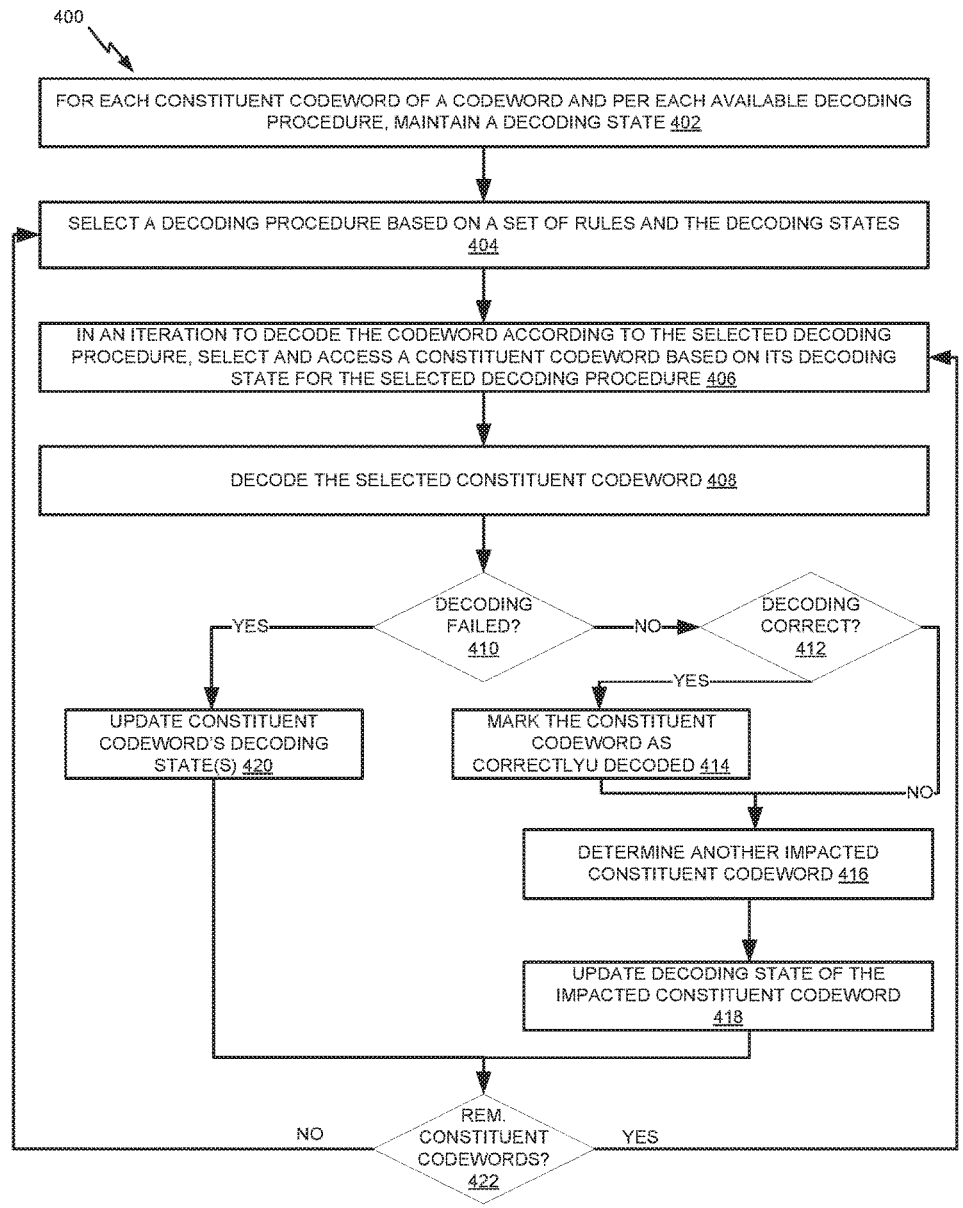
FIG. 4 illustrates an example flow for decoding a product codeword by selectively using decoding procedures based on state information, in accordance with certain embodiments of the present disclosure.
Figure 5:
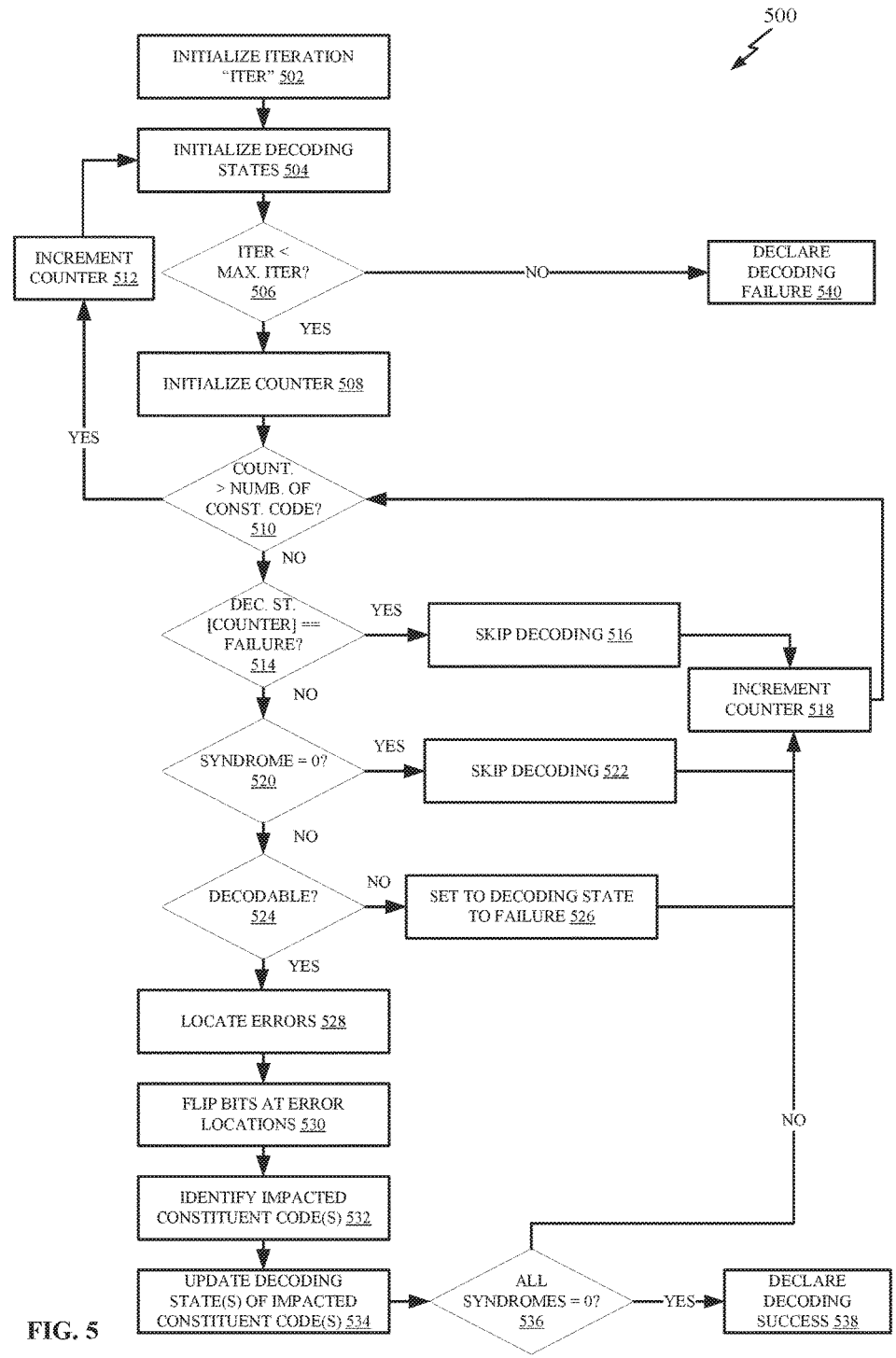
FIG. 5 illustrates an example flow for decoding a product codeword by using a selected decoding procedures and state information, in accordance with certain embodiments of the present disclosure.

Turning to FIGS. 4-5, the figures illustrate example flows for processing a product codeword, such as a TPC codeword. A system, such as an ECC system (e.g., the system 100 of FIG. 1) or a decoding system within the ECC system (e.g., the TPC decoder 140 of FIG. 1), may be configured to perform the illustrative flows. Instructions for performing the operations of the illustrative flows can be stored as computer-readable instructions on a non-transitory computer-readable medium of the system. As stored, the instructions represent programmable modules that include code or data executable by a processor of the system. The execution of such instructions configures the system to perform the specific operations shown in the figures and described herein. While the operations are illustrated in a particular order, it should be understood that no particular order is necessary and that one or more operations may be omitted, skipped, and/or reordered.

FIG. 4 illustrates an example flow 400 for decoding the product codeword by selectively using decoding procedures based on state information, in accordance with certain embodiments of the present disclosure. Multiple decoding procedures may be available. Some of these procedures may be more complex than others (e.g., may have higher decoding latency, but may result in a better BER). The example flow 400 is illustrated in connection with two decoding procedure: BCH decoding and Chase decoding. BCH decoding is a type of decoding procedure that uses syndrome decoding. Chase decoding is a type of decoding procedure that uses soft decoding information. Generally, BCH decoding is weaker (e.g., less complex) than Chase decoding. Of course other types and/or number of decoding procedures is similarly possible.

The example flow 400 starts at operation 402, where the system maintains a decoding state for each constituent codeword of the product codeword per each available decoding procedure. For example, the system maintains a BCH decoding state and a Chase decoding state for each row codeword and for each column codeword of a TPC code as illustrated in FIG. 3. The decoding states may be initialized to a certain value (e.g., "0" corresponding to an initial decoding state of "unknown"). The decoding states can be further updated based on the decoding of the product codeword, as further illustrated in the next operations. The decoding states can be maintained as arrays in memory of the system.

At operation 404, the system selects a decoding procedure based on a set of rules and the decoding states. For example, the set of rules is available from the memory of the system. The set of rules specifies the selection based on a number of conditions, some of which can depend on the decoding states.

In one example, the rules specify that the decoding should start with a less complex decoding procedure (e.g., one that has a relatively lower decoding latency) and then move to the more complex decoding procedure (e.g., one that has a relatively higher decoding latency) to improve the overall decoding latency of the system. In this example, BCH decoding is selected as the initial decoding procedure and Chase decoding is selected as the subsequent decoding procedure.

In another example, the rules specify whether the decoding should be locally iterative or globally iterative and the number of iterations. For instance, the rules specify that the BCH decoding should be iteratively performed for a predefined maximum number of times, followed by the Chase decoding also performed for a same or a different predefined maximum number of times.

In yet another example, the rules can be specific to a constituent codeword based on its decoding state(s). For instance and for a particular constituent codeword, if the BCH decoding state is "failed" and the Chase decoding state is "unknown," the selection is for the Chase decoding procedure. If the Chase decoding state is "failed," neither decoding procedures should be selected (because, if the stronger Chase decoding failed, the weaker BCH decoding is likely to fail too). If syndrome is used (whether represented in a decoding state or not), the rules can specify that once the syndrome of a particular constituent codeword is zero, the decoding of that particular constituent codeword is complete, and a selection for a decoding procedure is no longer needed (e.g., no additional decoding is applied to this particular constituent codeword).

At operation 406, in an iteration to decode the product codeword according to the selected decoding procedure, the system selects and accesses a constituent codeword based on the constituent codeword's decoding state for the selected decoding procedure. For example, if the decoding state of a constituent codeword is "failed" for the selected decoding procedure, that constituent codeword is not selected. Similarly, if the syndrome of the constituent codeword is zero (or its decoding state is "error free"), the constituent codeword is not selected. Otherwise, the constituent codeword is selected. These and other conditions for selecting constituent codewords can be specified in the set of rules. Once selected, the constituent codeword can be read from storage for decoding.

The selection can also be based on the structure of the product codeword. For example, The product codeword is originally constructed by encoding row constituent codewords first and then column constituent codewords second. In this example, the row constituent codewords are selected for decoding first. Within this subset of constituent codewords, the first row is selected, followed by a selection of the second one, and so on and so forth.

At operation 408, the system decodes the selected constituent codeword. For example, if BCH decoding was selected at operation 404, the constituent codeword is decoded by using this decoding procedure. Likewise, if Chase decoding was selected, the constituent codeword is decoded by using this decoding procedure. The decoding can be successful (e.g., resulting in an error free decoded constituent codeword), possible but containing errors, or can fail.

At operation 410, the system determines whether the decoding failed. In an example, the decoding procedure outputs an indication of the failure or not. For instance, in BCH decoding, if the syndrome of a decoded constituent codeword is larger than the number of parity bits, the BCH decoding could fail. If the decoding did not fail, operation 412 follows operation 410 to determine if the decoding was correct (e.g., the decoded constituent codeword is error free). Otherwise, operation 420 follows operation 410 to update the constituent codeword's decoding state for the selected decoding procedure.

At operation 412, the system determines whether the decoding was correct. For example, the syndrome of the decoded constituent codeword is used. If the syndrome is zero, the decoded constituent codeword is error free and the decoding is correct. otherwise, errors still exist and the decoding is incorrect. If the decoding is correct, operation 414 follows operation 412 to mark the decoding as successful. Otherwise, operation 416 follows operation 412 to determine the impact of the decoding to other constituent codewords.

At operation 414, the system marks the constituent codeword as correctly decoded. In one example, the syndrome of the constituent codeword (or some flag indicating that the decoding was correct) is stored. In another example, the decoding state(s) of the constituent codeword across the different decoding procedures is updated to an "error free" state. This update need not be limited to the selected decoding state of the selected decoding procedure but can be spread to all other decoding states of the constituent codeword. In this way, if another decoding procedure is subsequently selected, the decoding of the constituent codeword can be skipped. Of course, the update to the decoding state(s) given that the decoding was correct can be specified in the set of rules.

At operation 416, the system determines another constituent codeword impacted by the decoding of the selected constituent codeword. This operation follows either operation 412 or operation 414 and can be repeated for all impacted constituent codewords. In an example, the decoding of the selected codeword corrects (e.g., flips) a bit (e.g., a data bit) that is common with another constituent codeword. Because this bit was corrected (e.g., flipped), the system determines that the other constituent codeword is impacted.

At operation 418, the system updates the particular decoding state of the impacted constituent codeword for the selected decoding procedure. This operation can be repeated for all impacted constituent codewords, as determined at operation 416. In an example, if the particular decoding state was "failed," the update changes it to "unknown." If the particular decoding state was "unknown," the update does not change it. Such updates to decoding states can also be specified in the set of rules.

At operation 420, the system updates the constituent codeword's decoding state(s). Operation 420 is performed when the decoding of the selected constituent codeword according to the selected decoding procedure has failed, as determined at operation 410. In an example, the decoding state of the selected constituent codeword for the selected decoding procedure is updated to "failed."

Further, the update can be spread to the decoding state(s) of that constituent codewords for another decoding procedure(s) depending on how complex the selected decoding procedure is relative to the remaining one(s). Generally, if the selected decoding procedure is more complex than the remaining ones, the "failed" decoding state can be spread to the other decoding states. That is because, if the more complex decoding procedure has failed, the less complex ones are likely to fail too. Conversely, if the selected decoding procedure is less complex, the "failed" decoding state need not be spread to a more complex decoding procedure. These updates can also be specified in the set of rules.

To illustrate, if Chase decoding was selected and failed, the BCH decoding state is also updated to "failed." If BCH decoding was selected and failed, the Chase decoding state is not updated to "failed."

At operation 422, the system determines whether there is a remaining constituent codeword that has not been decoded. This operation follows either operation 418 or operation 422. If in the decoding iteration, a constituent codeword has not been decoded yet, the system loops back to operation 406 to select the constituent codeword (if the selection should be made given the relevant decoding state). If in the decoding iteration, no constituent codeword remain (e.g., all have been decoded or skipped), the system loops back to operation 404 to select the next decoding procedure (if one should be selected).

Once the system processes the various constituent codewords of the product code based on the above operations of the example flow 400, the product code would be decoded. More specifically, the decoding is complete if all constituent codewords are decoded (e.g., a "failed" decoding state does not exist). The decoding is correct if all syndromes are zeros. The decoding is failed if there is a "failed" decoding state.

FIG. 5 illustrates an example flow 500 for decoding a product codeword by using a selected decoding procedures and state information, in accordance with certain embodiments of the present disclosure. The example flow 500 is illustrated in connection with BCH decoding. However, the example flow 500 similarly applies to other decoding procedures.

The example flow starts at operation 502, where the system initializes the number of iterations for the BCH decoding. For example, this number is initialized to one and can be limited to an upper bound (e.g., a predefined maximum number of iterations).

At operation 504, the system initializes the BCH decoding states. For example, an array of flags is used. This array stores one bit of information for each BCH constituent codeword. These flags are initialized to zero for all BCH constituent codewords at the start of the decoding of the product codeword.

At operation 506, the system determines whether the number of iteration is less than the upper bound (e.g., the predefined maximum). If so, operation 508 is performed. Otherwise, operation 540 is performed.

At operation 508, the system initiates a counter for the BCH constituent codewords. This counter is used to track the decoding of the various BCH constituent codewords. In an example, the counter is initialized to one, indicating that the first BCH constituent codeword should be selected for decoding.

At operation 510, the system determines if the counter exceeds the number of constituent codewords of the product code. If so, operation 512 is performed, by which the system increments the counter, followed by operation 504. If not, operation 514 follows operation 510.

At operation 514, the system determines if the BCH decoding state of the BCH constituent codeword corresponding to the counter is "failed" or not. According to this operation, during the decoding iteration and before attempting the decoding of the BCH constituent codeword, its corresponding flag is checked. If the flag is "1" (e.g., its BCH decoding state is "failed"), the flag indicates that the decoding of this BCH codeword failed in some previous decoding iteration and no bit belonging to this BCH codeword has changed since the last decoding iteration. In this case, operation 516 is performed, by which the system skips the decoding of the BCH constituent codeword (because the BCH decoding previously failed and there has been no changes to the bits of the BCH constituent codeword), followed by operation 518 where the counter is incremented (thereby allowing the system to select and decode, as applicable, the next BCH constituent codeword; operation 510 follow operation 518). Otherwise decoding of this BCH codeword should be attempted. In this case, operation 520 follows operation 514.

At operation 520, the system determines whether the syndrome of the BCH constituent codeword is zero or not. The syndrome corresponds to a previous decoding of the BCH constituent codeword. If it is zero, the syndrome indicates that the previous decoding was correct. In this case, operation 520 is performed, by which the system skips the decoding of the BCH constituent codeword (because this codeword has already been correctly decoded), followed by operation 518 where the counter is incremented. Otherwise decoding of this BCH codeword proceeds. In this case, operation 524 follows operation 520.

At operation 524, the system determines whether the BCH constituent codeword is decodable according to the BCH decoding procedure. For example, the system attempts to decode the BCH constituent codeword. Whether it is decodable or not is an output of the BCH decoding procedure. If the decoding fails, operation 526 is performed, by which the system updates the BCH decoding state to "failed" (because the BCH decoding was not possible; this update sets the flag to "1"), followed by operation 518 where the counter is incremented. Otherwise, the BCH decoding is possible and operation 528 follows operation 524.

At operation 528, the system determines the error locations in the BCH constituent codeword. These locations are given by the BCH decoding procedure. At operation 530, the system flips the bits at the error locations.

At operation 532, the system identifies the BCH constituent codeword(s) that are impacted by the bit flipping. For example, the system determines to which BCH constituent codewords these error locations belong. Since each bit of the product codeword may be part of multiple BCH constituent codewords, each error location found by the BCH decoding attempt may change many other BCH constituent codewords. The system identifies these codewords given the error locations.

At operation 534, the system updates the BCH decoding state(s) of the impacted BCH constituent codeword(s). For example, these decoding states are updated to "unknown" by resetting their flags to "0."

At operation 536, the system determines if all decoded BCH constituent codewords have a syndrome of zero. If so, operation 538 is performed, by which the system declares the BCH decoding of the product codeword to be a success because all the BCH constituent codewords were decoded and are error free. Otherwise, operation 518 is performed to increment the counter.

At operation 540, the system declares that the decoding of the product code according to the BCH decoding procedure has failed. That is because at operation 540, the BCH decoding has been iteratively repeated for the predefined maximum number of times and because at least one BCH constituent codeword has a "failed" decoding state or has a non-zero syndrome (e.g., contains an error).

Figure 6:
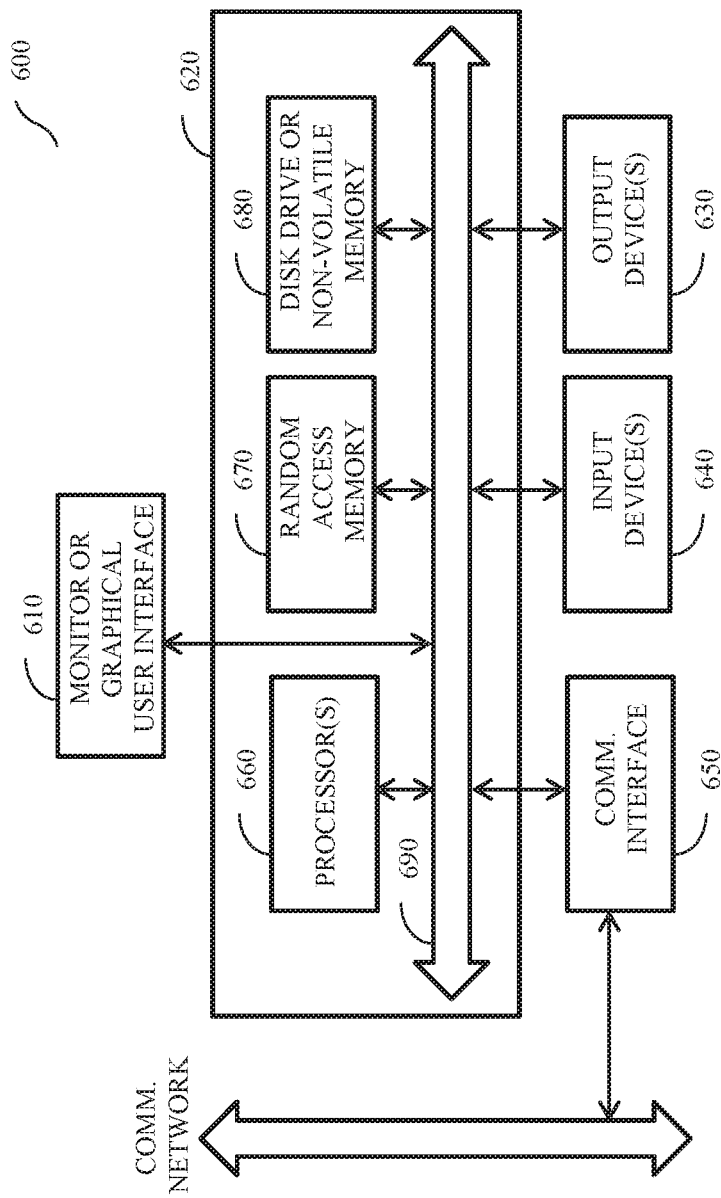
FIG. 6 describes one potential implementation of a system which may be used, according to one embodiment.

FIG. 6 describes one potential implementation of a system, which may be used according to one embodiment, such as the system 100 of FIG. 1. FIG. 6 is merely illustrative of an embodiment of the present disclosure and does not limit the scope of the disclosure as recited in the claims. In one embodiment, the system is a computer system 600 that typically includes a monitor 610, a computer 620, user output devices 630, user input devices 640, communications interface 650, and the like. The system 100 of FIG. 1 implements some or all of the components of the computer system 600.

As shown in FIG. 6, the computer 620 may include a processor(s) 660 that communicates with a number of peripheral devices via a bus subsystem 690. These peripheral devices may include the user output devices 630, the user input devices 640, the communications interface 650, and a storage subsystem, such as random access memory (RAM) 670 and disk drive 680.

The user input devices 630 include all possible types of devices and mechanisms for inputting information to the computer system 620. These may include a keyboard, a keypad, a touch screen incorporated into the display, audio input devices such as voice recognition systems, microphones, and other types of input devices. In various embodiments, the user input devices 630 are typically embodied as a computer mouse, a trackball, a track pad, a joystick, wireless remote, drawing tablet, voice command system, eye tracking system, and the like. The user input devices 630 typically allow a user to select objects, icons, text and the like that appear on the monitor 610 via a command such as a click of a button or the like.

The user output devices 640 include all possible types of devices and mechanisms for outputting information from the computer 620. These may include a display (e.g., the monitor 610), non-visual displays such as audio output devices, etc.

The communications interface 650 provides an interface to other communication networks and devices. The communications interface 650 may serve as an interface for receiving data from and transmitting data to other systems. Embodiments of the communications interface 650 typically include an Ethernet card, a modem (telephone, satellite, cable, ISDN), (asynchronous) digital subscriber line (DSL) unit, FireWire interface, USB interface, and the like. For example, the communications interface 650 may be coupled to a computer network, to a FireWire bus, or the like. In other embodiments, the communications interfaces 650 may be physically integrated on the motherboard of the computer 620, and may be a software program, such as soft DSL, or the like.

In various embodiments, the computer system 600 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 620 includes one or more Xeon microprocessors from Intel as the processor(s) 660. Further, one embodiment, the computer 620 includes a UNIX-based operating system.

The RAM 670 and the disk drive 680 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 670 and the disk drive 680 may be configured to store the basic programming and data constructs that provide the functionality of the present disclosure.

Software code modules and instructions that provide the functionality of the present disclosure may be stored in the RAM 670 and the disk drive 680. These software modules may be executed by the processor(s) 660. The RAM 670 and the disk drive 680 may also provide a repository for storing data used in accordance with the present disclosure.

The RAM 670 and the disk drive 680 may include a number of memories including a main random access memory (RAM) for storage of instructions and data during program execution and a read only memory (ROM) in which fixed non-transitory instructions are stored. The RAM 670 and the disk drive 680 may include a file storage subsystem providing persistent (non-volatile) storage for program and data files. The RAM 670 and the disk drive 680 may also include removable storage systems, such as removable flash memory.

The bus subsystem 690 provides a mechanism for letting the various components and subsystems of the computer 620 communicate with each other as intended. Although the bus subsystem 690 is shown schematically as a single bus, alternative embodiments of the bus subsystem may utilize multiple busses.

FIG. 6 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A system for reduced-latency decoding, comprising:
a memory accessible via a memory channel;
an encoder module configured to encode a data block in a codeword, the data block accessed from the memory via the memory channel; and
a reduced-latency decoder module configured to:
maintain in the memory a first decoding state and a second decoding state associated with decoding a first constituent codeword according to a first decoding procedure and a second decoding procedure, respectively, wherein:
the first constituent codeword is one of a plurality of constituent codewords that constitute the codeword,
a data bit of the codeword is protected by the first constituent codeword and by at least a second constituent codeword of the codeword; and
in an iteration to decode the codeword according to the first decoding procedure:
prior to decoding the first constituent codeword according to the first decoding procedure, determine whether the first decoding state indicates a decoding failure, and
if the first decoding state indicates the decoding failure, lower a decoding latency by skipping the decoding of the first constituent codeword according to the first decoding procedure, or
if the first decoding state does not indicate the decoding failure:
decode the first constituent codeword according to the first decoding procedure, wherein the decoding of the first constituent codeword according to the first decoding procedure at least flips the data bit common with the second constituent codeword to correct an error, and
update in the memory a decoding state of the second constituent codeword based on the flipping of the data bit, the decoding state associated with decoding the second constituent codeword according to the first decoding procedure.

2. The system of claim 1, wherein the codeword is decoded by at least decoding each constituent codeword according to the first decoding procedure or the second decoding procedure, wherein each constituent codeword is decoded based on decoding states corresponding to the constituent codeword and associated with the first decoding procedure and the second decoding procedure.

3. The system of claim 1, wherein the first constituent codeword comprises a second data bit that is common with a third constituent codeword, and wherein the reduced-latency decoder module is further configured to:
in the iteration to decode the codeword:
decode the third constituent codeword according to the first decoding procedure, wherein the decoding of the third constituent codeword flips the second data bit;
determine that the first decoding state should be updated based on the second data bit being flipped and being common to the first constituent codeword; and
update the first decoding state based on the determination that the first decoding state should be updated.

4. The system of claim 3, wherein the first decoding state comprises a value that corresponds to either the decoding failure or to an unknown decoding state, and wherein updating the first decoding state is based on a set of rules available from the memory of the system.

5. The system of claim 4, wherein the set of rules specifies that:
if the first decoding state indicates the decoding failure, the value is to be changed from indicating the decoding failure to indicating the unknown decoding state; and
if the first decoding state does not indicate the decoding failure, the value should be kept as indicating the unknown decoding state.

6. The system of claim 1, wherein the first decoding state indicates the decoding failure, and wherein the instructions further cause the system to:
determine, based on the second decoding state, whether to decode the first constituent codeword according to the second decoding procedure; and
if the second decoding state indicates a decoding failure according to the second decoding procedure, declare a failure to decode the codeword, or
if the second decoding state does not indicate the decoding failure according to the second decoding procedure, decode the first constituent codeword according to the second decoding procedure.

7. The system of claim 6, wherein the decoding of the first constituent codeword according to the second decoding procedure is performed in a next iteration for decoding the codeword according to the second decoding procedure and at least flips the data bit common with the second constituent codeword to correct the error and updates the decoding state of the second constituent codeword based on the flipping of the data bit.

8. The system of claim 6, wherein the second decoding procedure has a better bit error rate (BER) performance relative to the first decoding procedure, wherein the first decoding procedure has a lower decoding latency relative to the second decoding procedure, wherein the determination of whether to decode the first constituent codeword according to the second decoding procedure is based on a set of rules available from the memory, and wherein the set of rules specifies that:

if the first decoding state does not indicate the decoding failure according to the first decoding procedure, the reduced-latency decoder module should further lower the decoding latency by decoding the first constituent codeword according to the first decoding procedure,
if the first decoding state indicates the decoding failure according to the first decoding procedure and if the second decoding state does not indicate the decoding failure according to the second decoding procedure, the first constituent codeword should be decoded according to the second decoding procedure, and
if the second decoding state indicates the decoding failure according to the second decoding procedure, the first constituent codeword cannot be decoded according to either the first decoding procedure or the second decoding procedure.

9. The system of claim 1, wherein the second decoding procedure has a better bit error rate (BER) performance relative to the first decoding procedure, wherein the first constituent code is decoded according to the first decoding procedure in the iteration to decode the codeword, and wherein the reduced-latency decoder module is further configured to:
in a next iteration to decode the codeword according to the second decoding procedure, determine whether a syndrome of the first constituent codeword is zero, wherein the syndrome corresponds to the decoding of the first constituent codeword according to the first decoding procedure; and
if the syndrome is zero, further lower a decoding latency by skipping the decoding of the first constituent codeword according to the second decoding procedure, or
if the syndrome is different from zero, determine, based on the second decoding state, whether to decode the first constituent codeword according to the second decoding procedure.

10. The system of claim 9, wherein the determination of whether to decode the first constituent codeword according to the second decoding procedure is based on a set of rules available from the memory, and wherein the set of rules specifies that:
if the second decoding state indicates a decoding failure according to the second decoding procedure, a failure to decode the codeword should be declared, and
if the second decoding state does not indicate the decoding failure according to the second decoding procedure, the first constituent codeword should be decoded according to the second decoding procedure.

11. A method for reduced-latency codeword decoding, the method comprising:
maintaining, by a reduced-latency decoder module and in a memory accessible via a memory channel, a first decoding state and a second decoding state associated with decoding a first constituent codeword according to a first decoding procedure and a second decoding procedure, respectively, wherein:
the first constituent codeword is one of a plurality of constituent codewords that constitute the codeword,
a data bit of the codeword is protected by the first constituent codeword and by at least a second constituent codeword of the codeword; and
in an iteration by the reduced-latency decoder module to decode the codeword according to the first decoding procedure:
prior to decoding the first constituent codeword according to the first decoding procedure, determining, by the reduced-latency decoder module, whether the first decoding state indicates a decoding failure, and if the first decoding state indicates the decoding failure, lowering a decoding latency by skipping, by the reduced-latency decoder module, the decoding of the first constituent codeword according to the first decoding procedure, or if the first decoding state does not indicate the decoding failure:

decoding, by the reduced-latency decoder module, the first constituent codeword according to the first decoding procedure, wherein the decoding of the first constituent codeword according to the first decoding procedure at least flips the data bit common with the second constituent codeword to correct an error, and updating, by the reduced-latency decoder module and in the memory, a decoding state of the second constituent codeword based on the flipping of the data bit, the decoding state associated with decoding the second constituent codeword according to the first decoding procedure.

12. The method of claim 11, wherein maintaining the first decoding state comprises:

determining that a previous decoding of the first constituent codeword according to the first decoding procedure failed in a previous iteration to decode the codeword according to the first decoding procedure; and setting the first decoding state to a value that corresponds to the decoding failure based on the determination that the previous decoding failed.

13. The method of claim 11, wherein the decoding of the first constituent codeword is skipped in the iteration to decode the codeword based on the decoding state indicating the decoding failure, and wherein maintaining the first decoding state comprises:

determining that the data bit common with the second constituent codeword was flipped based on a decoding of the second constituent codeword in the iteration to decode the codeword according to the first decoding procedure; and setting the first decoding state to a value that corresponds an unknown decoding state.

14. The method of claim 11, wherein the second decoding procedure has a better bit error rate (BER) performance relative to the first decoding procedure, wherein the first decoding procedure has a lower decoding latency relative to the second decoding procedure, wherein the first decoding state does not indicate the decoding failure, and wherein maintaining the second decoding state comprises setting the second decoding state to a value that corresponds to an unknown decoding state based on the first decoding state not indicating the decoding failure.

15. The method of claim 11, wherein the second decoding procedure has a better bit error rate (BER) performance relative to the first decoding procedure, wherein the first constituent codeword is decoded according to the first decoding procedure and has a decoding syndrome equal to zero, and wherein maintaining the second decoding state comprises setting the second decoding state to a value that corresponds to an unknown decoding state based on the decoding syndrome being equal to zero.

16. A non-transitory computer-readable storage medium storing instructions that, upon execution by a processor of a system, configure a reduced-latency decoder module implemented by the system to perform operations to encode a data block in a codeword, the data block accessed from a memory via a memory channel, the operations comprising:

maintaining, in the memory, a first decoding state and a second decoding state associated with decoding a first constituent codeword according to a first decoding procedure and a second decoding procedure, respectively, wherein:

the first constituent codeword is one of a plurality of constituent codewords that constitute the codeword, a data bit of the codeword is protected by the first constituent codeword and by at least a second constituent codeword of the codeword; and in an iteration to decode the codeword according to the first decoding procedure:

prior to decoding the first constituent codeword according to the first decoding procedure, determining whether the first decoding state indicates a decoding failure, and if the first decoding state indicates the decoding failure, lower a decoding latency by skipping the decoding of the first constituent codeword according to the first decoding procedure, or if the first decoding state does not indicate the decoding failure:

decoding the first constituent codeword according to the first decoding procedure, wherein the decoding of the first constituent codeword according to the first decoding procedure at least flips the data bit common with the second constituent codeword to correct an error, and updating in the memory a decoding state of the second constituent codeword based on the flipping of the data bit, the decoding state associated with decoding the second constituent codeword according to the first decoding procedure.

17. The non-transitory computer-readable storage medium of claim 16, wherein the codeword comprises at least one of: a turbo product code, a generalized product code, or a generalized low density parity check code.

18. The non-transitory computer-readable storage medium of claim 17, wherein the first constituent codeword comprises at least one of: a Bose-Chaudhuri-Hocquenghem (BCH) codeword or a Reed-Solomon codeword.

19. The non-transitory computer-readable storage medium of claim 16, wherein the first decoding procedure uses syndrome decoding, and wherein the second decoding procedure uses soft decoding information.

20. The non-transitory computer-readable storage medium of claim 19, wherein the first decoding procedure comprises Bose-Chaudhuri-Hocquenghem (BCH) decoding, wherein the second decoding procedure comprises Chase decoding, and wherein if the first decoding state does not indicate the decoding failure according to the first decoding procedure, the reduced-latency decoder module further lowers the decoding latency by decoding the first constituent codeword according to the first decoding procedure.

* * * * *